United States Patent [19]
Gaboury et al.

[11] Patent Number: 6,005,500
[45] Date of Patent: *Dec. 21, 1999

[54] TRANSMITTER WITH IMPROVED ANALOG TO DIGITAL CONVERTER

[75] Inventors: Michael Gaboury, Burnsville; Ramesh Harjani, Minneapolis, both of Minn.

[73] Assignee: Rosemount, Inc., Eden Prairie, Minn.

[*] Notice: This patent issued on a continued prosecution application filed under 37 CFR 1.53(d), and is subject to the twenty year patent term provisions of 35 U.S.C. 154(a)(2).

[21] Appl. No.: 08/870,305

[22] Filed: Jun. 6, 1997

[51] Int. Cl.$^6$ ...................................................... H03M 3/00
[52] U.S. Cl. .............................................. 341/43; 341/118
[58] Field of Search ............................. 341/76, 118, 139, 341/143, 155

[56] References Cited

U.S. PATENT DOCUMENTS

| | | | |
|---|---|---|---|
| 4,851,841 | 7/1989 | Sooch | 341/143 |
| 5,075,679 | 12/1991 | Gazsi | 341/143 |
| 5,134,401 | 7/1992 | McCartney et al. | 341/143 |
| 5,241,310 | 8/1993 | Tiemann | 341/143 |
| 5,305,004 | 4/1994 | Fattaruso | 341/120 |
| 5,311,181 | 5/1994 | Ferguson, Jr. et al. | 341/143 |
| 5,451,949 | 9/1995 | Gundry | 341/143 |
| 5,483,238 | 1/1996 | Norsworthy et al. | 341/131 |
| 5,541,600 | 7/1996 | Blumenkrantz et al. | 341/139 |
| 5,592,165 | 1/1997 | Jackson et al. | 341/143 |
| 5,731,769 | 3/1998 | Girardeau, Jr. et al. | 341/61 |
| 5,804,825 | 9/1998 | Schuler | 250/339.15 |
| 5,821,890 | 10/1998 | Kim et al. | 341/143 |

OTHER PUBLICATIONS

"The Design of Sigma–Delta Modulation Analog–to–Digital Converters," by B. Boser et al., *IEE Journal of Solid–State Circuits,* vol. 23, No. 6, Dec. 1988, pp. 1298–1308.

"An Overview of Oversampling Methods for A/D and D/A Conversion," By J. Candy, AT&T Bell Laboratories, Holmdel, New Jersey, pp. 1–15.

"Delta–Sigma–Delta Modulator: An Autoranging A/D Converter," by M. Gaboury et al., Department of Electrical Engineering, University of Minnesota.

*Primary Examiner*—Michael Tokar
*Assistant Examiner*—Peguy JeanPierre
*Attorney, Agent, or Firm*—Westman, Champlin & Kelly, P.A.

[57] ABSTRACT

A transmitter includes a sensor adapted to sense a process variable and responsively provide a sensor analog output. An analog to digital converter provides a digitized output in response to the sensor analog output within a converter dynamic range. Signal range bracketing circuitry provides a bracketed range of the sensor analog output to the analog to digital converter for conversion. Outputs from the signal range bracketing circuitry and the analog to digital converter together provide a digital representation of the sensor analog output signal.

12 Claims, 4 Drawing Sheets

TRANSMITTER WITH IMPROVED ANALOG TO DIGITAL CONVERTER

BACKGROUND OF THE INVENTION

The present invention relates to transmitters of the type used in the process control industry which include a sensor for sensing a process variable. More specifically, the present invention relates to an improved sigma-delta analog to digital converter for converting an analog signal from such a sensor into a digital value.

Transmitters in the process control industry typically communicate with a controller using the same two wires over which they receive power. A transmitter receives commands from a controller and sends output signals representative of a sensed physical parameter (i.e., a process variable) back to the controller.

The transmitter includes a sensor for sensing the process variable. The sensor provides an analog output signal which is representative of the process variable. Such process variables include pressure, temperature, flow, pH, turbidity, gas concentration, etc. Many process variables have a very large dynamic range, for example, in some signals the amplitude can range by a factor of 10,000.

An analog to digital converter in the transmitter converts the analog sensor signal to a digital representation of the sensed physical parameter for subsequent analysis in the transmitter or for transmission to a remote location. Typically, a microprocessor in the transmitter compensates the digitized signal and an output circuit and the transmitter sends an output representative of the compensated physical parameter to the remote location. Although the digitized signal may be updated only a few times per second depending on the nature of the process to be controlled, the converter is frequently required to have, for example, 16 bits of resolution and be substantially insensitive to noise. Sigma-delta converters are used as analog to digital converters in transmitters. One embodiment of such a converter is a charge balance converter in which a capacitor is charged to a positive or negative potential and the resulting packets of charge are accumulated in an integrator. The charge is transferred onto a capacitor in the circuit by semiconductor based switches. The accumulated charge, which is representative of the sensed parameter, is compared to a reference level and the resulting output is used as a feedback signal to control the switch action, and therefore, the accumulation of positive and negative charge packets in the integrator. A digital representation of the sensed parameters is determined by counting the number of switch actuations.

One limitation of prior art analog to digital converters is that in order for them to be functional over a wide dynamic range, resolution must be sacrificed. This is particularly problematic, for example, with process variable sensors in which the sensor signal output has a large DC value which varies slowly with time, and a small AC signal which varies more rapidly. Thus, if it is necessary to measure the small AC signal to a specific accuracy, 0.1% for example, then the resolution of the analog to digital converter required to achieve this accuracy is not just the 10 bits of resolutions required to result to 0.1%. The resolution must be much higher due to the DC offset term which must also be accommodated in the A/D dynamic range.

SUMMARY OF THE INVENTION

A transmitter of the type used to sense a process variable in an industrial process includes a sensor coupled to the process providing a sensor analog output representative of the process variable. The sensor analog output has a sensor signal range. An analog to digital converter provides a digitized output in response to an analog input within a converter dynamic range. The analog input is operably coupled to the sensor analog output. Signal range bracketing circuitry operably couples to the sensor analog output responsively provides a bracketed range of the sensor analog output to the analog to digital converter. The bracketed range is less than the sensor signal range. The sensor signal bracketing circuitry provides a bracket output indicative of the bracketed range wherein the bracket output and the digitized output are representative of the sensor analog output.

In one aspect of the invention, the analog to digital converter is a sigma-delta converter and the signal range bracketing circuitry is a delta modulator. Another aspect of the invention includes selecting a bracketed range which has a range equal to the converter dynamic range.

DETAILED DESCRIPTION OF THE PREFERRED EMBODIMENTS

Figure 1:
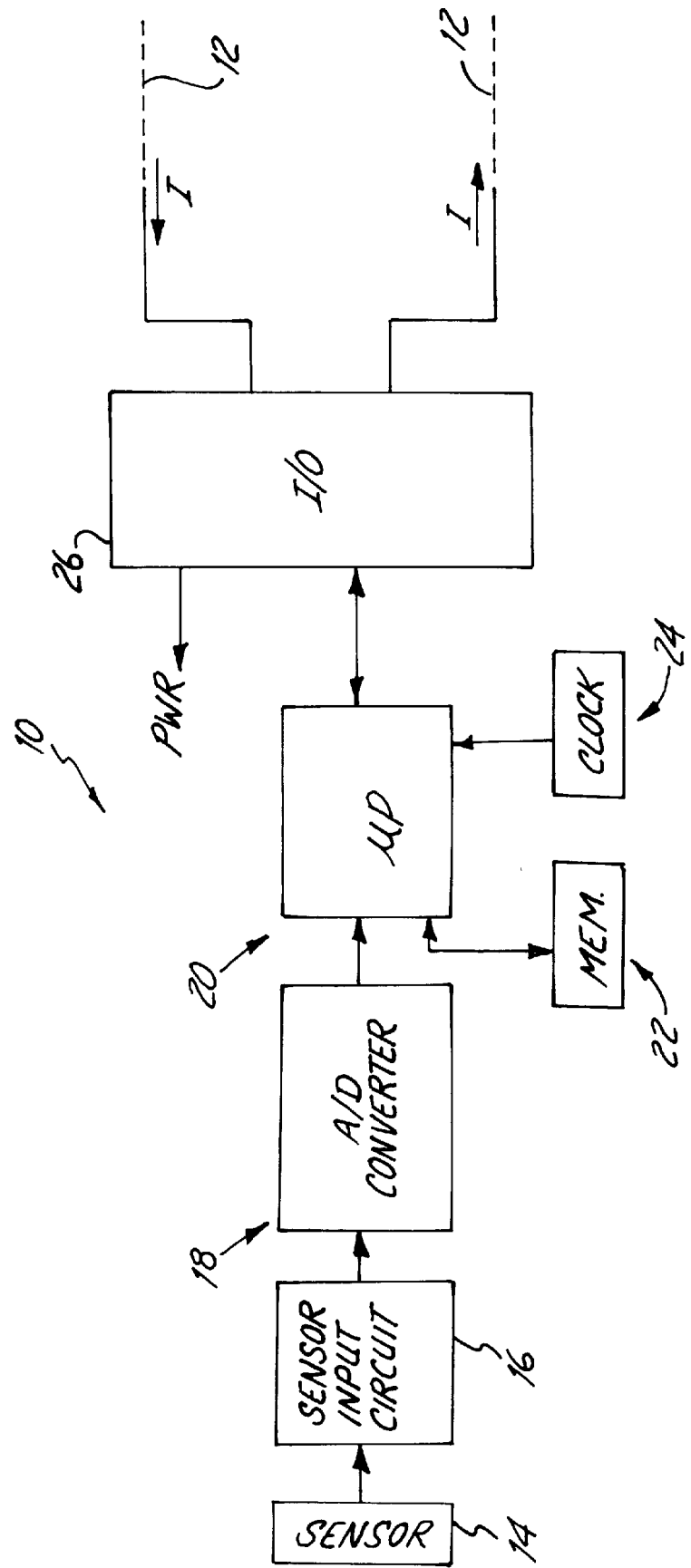
FIG. 1 is a simplified block diagram of a transmitter including an analog to digital converter in accordance with the present invention.

FIG. 1 is a simplified block diagram of a transmitter 10 in accordance with the present invention. Transmitter 10 is coupled to process control loop 12 which carries a current I. For example, loop 12 may be a 4–20 mA process control loop or may operate in accordance with HART® or Fieldbus communication protocols. Transmitter 10 includes process variable sensor 14 which couples to a process. Sensor 14 may be, for example, a pressure, temperature, pH, flow, etc. sensor which provides an analog output to sensor input circuitry 16. Sensor input circuitry 16 amplifies and filters the analog sensor signal, as appropriate, and provides the sensor signal to analog to digital converter 18 which operates in accordance with the present invention and will be described below in greater detail. Analog to digital converter 18 provides a digitized output to microprocessor 20 which is representative of the sensor analog output signal. Microprocessor 20 is coupled to memory 22 and clock 24 and operates in accordance with instructions stored in memory 22 at a rate determined by clock 24. Clock 24 is also used to clock circuitry in analog to digital converter 18. Microprocessor 20 sends and receives data over loop 12 using input/output circuitry 26 which also provides a power output which is used to power the circuitry of transmitter 10 completely from power drive from control loop 12. Input/output circuitry 26 may, in various embodiments, transmit information in a digital format on loop 12 or in an analog format by controlling current I flowing through loop 12.

Figure 2:
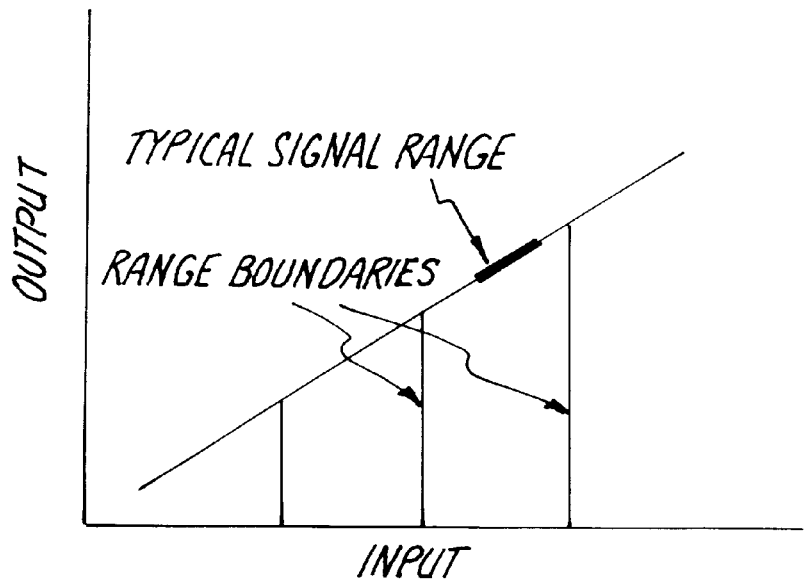
FIG. 2 is a graph which illustrates signal ranges of an analog signal to be converted using the analog to digital converter of FIG. 1.

FIG. 2 is a graph of output versus input for an analog to digital converter in a typical process control environment. As shown in FIG. 2, there are a applications which require measurement of a small signals in the presence of a large DC offset component. For instance, quite often signals from sensors have a large DC value with a small time varying component representing the time difference in the respective variable being measured. If the transmitter is required to measure this small variation to a specific accuracy, say 0.1%, then the resolution of an A/D converter required to achieve this accuracy is not just 10 bits to resolve this accuracy but much higher due to the DC offset term which must also be accommodated in the input dynamic range.

The minimum A/D converter resolution for a given application, is only achieved when the input signal spans the entire input dynamic range. Typically in the prior art, the A/D converter is preceded by a simple gain stage if the signal does not have an offset. As discussed above, however, many signals do not have this luxury. Alternately, the "zero" for the A/D converter can be offset by an appropriate voltage to accommodate the input signal. The present invention includes a new data converter architecture that automatically calculates and generates the necessary offset term, thus reducing the resolution requirements of the data converter in the presence of a DC offset.

Figure 3:
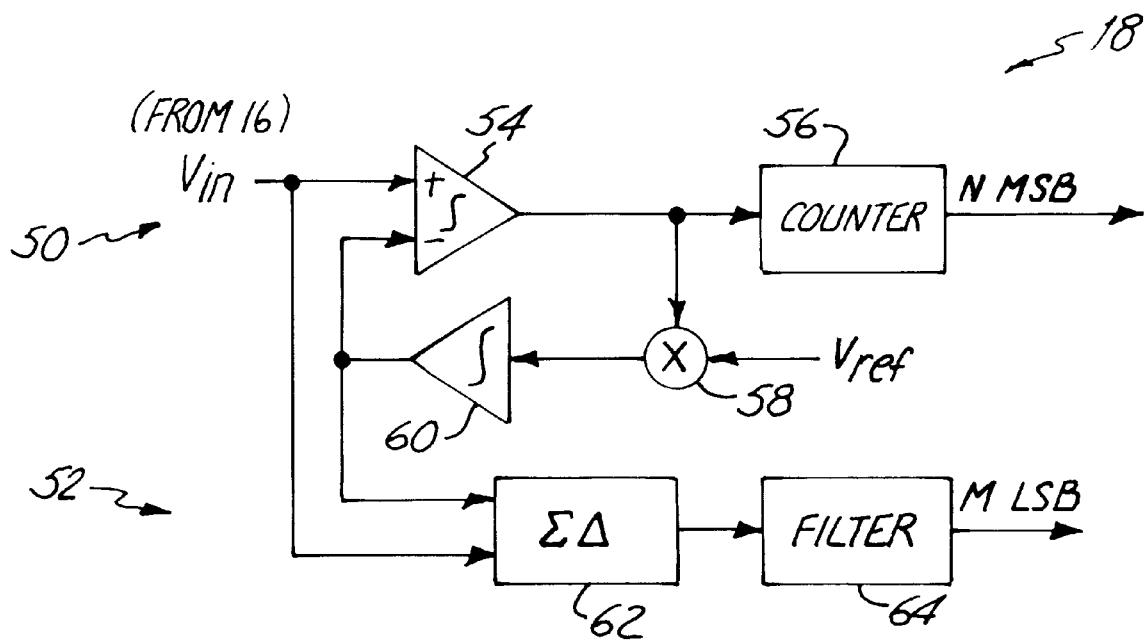
FIG. 3 is a simplified block diagram of the analog to digital converter shown in FIG. 1.

A simplified block diagram for analog to digital converter 18 is shown in FIG. 3. The basic architecture can be broken up into two primary functions. First, a delta modulator 50 is used to bracket the desired signal range. This bracketing is depicted by the vertical lines shown in FIG. 2. Second, a sigma-delta modulator 52 uses the bracketed range as a reference voltage and measures the signal as a ratio of this range, thus effectively achieving offset reduction and the necessary gain of the desired input signal. Each range determined by the delta modulator stage must at a minimum be large enough to accommodate the largest possible signal range, to avoid a fold over distortion.

Delta modulator 50 includes comparator 54. Comparator 54 has a noninverting input connecting to circuit 16 for receiving an input voltage $V_{IN}$. The output of comparator 54 couples to a counter 56 which provides an output N representative of $V_{REF}$ switched in response to the output from comparator 54. The output of comparator 54 also couples to switch 58 which receives a voltage reference input $V_{REF}$ and provides an output to integrator 60. The output to integrator 60 from switch 58 is related to the output from comparator 54 multiplied by the voltage reference $V_{REF}$. The output from integrator 60 couples to the inverting input of comparator 54. The sigma-delta modulator 52 includes a sigma-delta stage 62 coupled to the input signal $V_{IN}$ and the output from integrator 60. The output from sigma-delta converter 62 couples to digital decimating filter 64 which provides an output M representative of $V_{REF}$ switched in response to the output from comparator 54. Thus, the total bits output from analog to digital converter is equal to N plus M and, when taken together, provide a complete representation of the input signal $V_{IN}$. Typically, all components in analog to digital converter 18 are controlled by a clock signal which can be derived from clock 24 shown in FIG. 1.

The system operation can be described simply as follows. Initially the clocks to the sigma-delta modulator section 52 are off and the delta modulator 50 is used to bracket the signal range of the input signal $V_{IN}$. At each clock cycle the input voltage $V_{IN}$ is compared by comparator 54 to the quantized feedback of the delta modulator integrator 60. Eventually the integrator 60 will acquire a charge on its feedback capacitor (not shown in FIG. 3) sufficient to make this quantized feedback larger than the input signal $V_{IN}$ and output of comparator 54 output will trip. If the input range is less than the step size of the integrator 60, the output of comparator 54 will then toggle between 2 levels of quantization. It is well known that a sigma-delta modulator gain can be affected by the reference voltage used in the feedback. If the sigma-delta modulator clocks are started using the lower quantization voltage to subtract the DC offset from the input, and the use difference of the two levels as the reference voltage, delta modulator has effectively bracketed the input signal $V_{IN}$.

Using FIG. 3, it is possible to derive the fundamental equations for modulator circuit 50 and 52 which are listed below as equations (1) and (2). For these derivations, non-ideal effects such as noise and offsets are neglected.

The time domain equations for the delta modulator 50 and sigma-delta modulator 52 respectively, are:

$$\text{Vod}(n)=A\cdot(\text{Vocd}(n)\cdot\text{Vref}(n)-\overline{\text{Vocd}(n)}\cdot\text{Vref}(n))+\text{Vod}(n-1) \quad \text{Eq. (1)}$$

$$Vodsd(n) = B\cdot\left[\sum_{n=m}^{N}(\overline{Vocs(n)} - Voc(n))\cdot Vref(n) + \sum_{n=m}^{N}((Vocs(n) - \overline{Vocs(n)})\cdot Vod(n))\right] \quad \text{Eq. (2)}$$

where A and B are capacitor ratios.

Since these time domain equations do not provide an intuitive explanation for the operation of converter 18, the equations can be reduced further using the assumptions that $V_{REF}$ and $V_{IN}$ are essentially DC signals for a given conversion period. Then, if N1 and N2 are the number of ones and zeros outputted by the sigma-delta modulator respectively, equation (2) simplifies to equation (3):

$$\frac{Vin - Vod(low)}{Vod(high) - Vod(low))} = \frac{N1 - N2}{N1 + N2} \quad \text{Eq. (3)}$$

This equation represents the ratiometric value of the input of the sigma delta modulator with respect to the range defined by the delta modulator. This equation is for a sinc function, however, other functions or higher order sinc functions may be used.

In the present design, the quantization error reduces for higher oversampling ratios. In addition to the quantization noise two other significant error sources are present in this architecture. Both of these errors are a consequence of non-ideal integrator behavior. The first and most difficult problem is drift in the delta modulator integrator 60. This will result in a DC error term that drifts with time. In order to examine the effects of this drift, the system can be modeled by assuming two possible methods of leakage.

Under a first assumption, leakage current due to the reverse biased junction current for the switch S/D regions were modeled as a constant current and therefore results in a gain error. The second error term is resistive leakage which is modeled as a percentage loss of charge per cycle. This effect is dependent on the absolute voltage stored on the integration capacitors. Both of these effects can be mitigated in two ways: using short conversion cycles or by periodically resetting the modulator 50.

The second source of error is due to boundary transitions. When the input $V_{IN}$ is nearly equal to a boundary value of delta modulator 50, modulator 50 can jump freely between two stable regions due to noise on the input signal $V_{IN}$ and noise in delta modulator integrator 60 output. However, properly phased clocking scheme which insures correct charge transfer from the input can eliminate errors of this type to a large extent. Further, a better technique to reduce these errors is to provide for a range shift when this condition is detected. The delta modulator boundary values eventually assume values which no longer contain the input signal $V_{IN}$ and a fold over error occurs when the circuit must count twice consecutively in one direction.

Several methods of implementing a range shift are possible. One largely error free method is to use a multiple sample charge transfer in the delta modulator integrator 60. This method uses the same capacitor to transfer charge and can therefore make a sub-integral (for example, one half) range shift, giving rise to only the voltage coefficient error of the capacitor. One problem with the method is the complex clocking which may lead to a less power efficient solution. A second solution which has been employed in a test chip design is to change the reference voltage $V_{REF}$ either momentarily, to adjust the range, or to make a more permanent shift in the boundary values. Unfortunately this will change the gain of the system and range of each delta modulator region. Another issue associated with the boundary transition error is the potential of filter errors and saturation of the sigma-delta section 52 at the extremes of the input. In one embodiment, a simple sinc filter is used for the sigma-delta converter low-pass filter 64 to provide a constant quantization error over the entire range. Additionally the two techniques described above can help reduce the problem of integrator saturation.

An analysis based on the quantization error of the present invention and the traditional sigma-delta modulator shows that there is a trade-off which can be made between the two techniques for optimizing system power when not limited by the thermal noise. The over-sampling ratios (OSR) for a traditional sigma-delta modulator and the present invention are shown in equations (4) and (5) respectively. A summary table of specific results is listed below at Table 1.

$$OSR = \left[\frac{\frac{1}{2^{N+1}}}{\frac{1}{12} \cdot \Delta^2 \cdot \frac{\pi}{\sqrt{2 \cdot L + 1}}}\right]^{-\left(\frac{1}{L+\frac{1}{2}}\right)} \quad \text{Eq. (4)}$$

$$OSRd = \left[\frac{\frac{1}{2^{Nd+1}}}{\frac{1}{12} \cdot \Delta d^2 \cdot \frac{\pi}{\sqrt{2 \cdot Ld + 1}}}\right]^{-\left(\frac{1}{Ld+\frac{1}{2}}\right)} \quad \text{Eq. (5)}$$

TABLE 1

OSR Requirements

| Resolution effective # bits | DSD 1st order 4 steps | DSD 1st order 8 steps | Sigma-Delta 1st order | Sigma-Delta 2nd order |
|---|---|---|---|---|
| 8 | 10 | 4 | 61 | 11 |
| 12 | 62 | 24 | 391 | 32 |
| 16 | 391 | 155 | 2484 | 98 |
| 20 | 2484 | 985 | 15770 | 298 |

The thermal noise performance of the sigma-delta integrator must be the same with this architecture since the input signal $V_{IN}$ has not truly been amplified. The effective equivalent input noise performance is then the same with both techniques. However, the amplifier in the delta modulator integrator 60 may have reduced requirements and hence some power savings may be gained.

Effects from capacitor nonlinearity will be essentially the same as a prior art sigma-delta modulator with the additional complication of the voltage coefficients causing a gain and offset difference at each range of the delta modulator 50. Since this error is monotonic, it can be calibrated out in the final system. Signals crossing the boundary should cause no additional nonlinearity. The noise will be averaged along with the signal and will be reduced as in previous systems by $1/\sqrt{N}$ where N is the number of samples.

Figure 4:
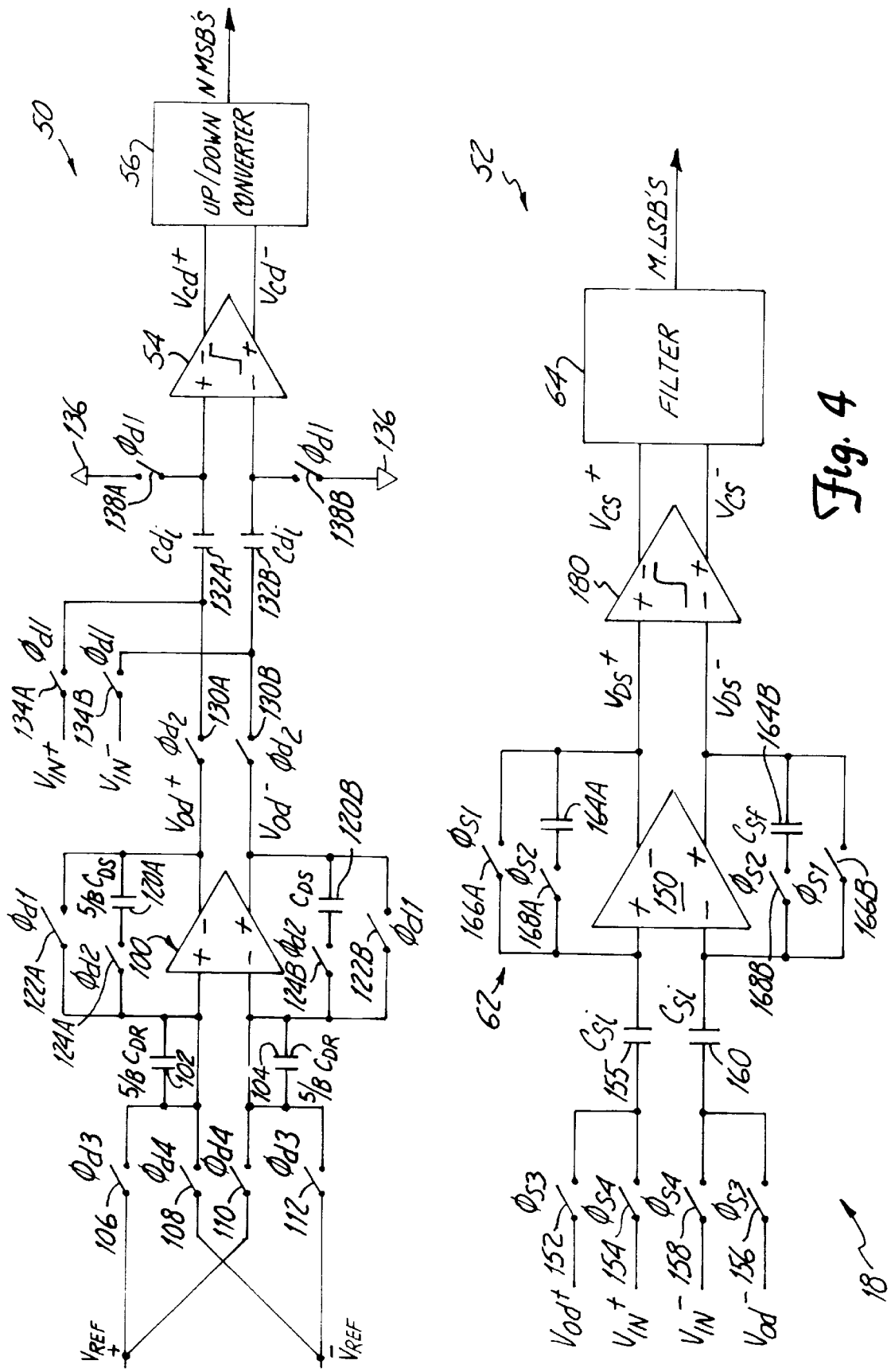
FIG. 4 is a more detailed block diagram of the analog to digital converter shown in FIG. 3.

FIG. 4 is a simplified block diagram of analog to digital conversion circuitry 18 showing greater detail than is shown in FIG. 3. Integrator 60 is formed by amplifier 100 having inverting and noninverting inputs and outputs. The inputs of amplifier 100 are connected to positive and negative reference voltages $V_{REF}+$ and $V_{REF}-$, respectively, through capacitors 102 and 104 ($C_{DR}$) and switches 106, 108, 110 and 112 which are controlled by control signals $\phi_{D3}$, $\phi_{D4}$, $\phi_{D4}$, $\phi_{D3}$, respectively. As shown in FIG. 4, feedback is provided to amplifier 100 through capacitors 120A and 120B ($C_{DS}$) and switches 122A, 122B and 124A, 124B, respectively. Amplifier 100 provides inverted and noninverted outputs $V_{OD}+$ and $V_{OD}-$, respectively, to switches 130A and 130B driven by control signals $\phi_{D2}$ and which are connected to comparator 54 through capacitors 132A and 132B ($C_{DI}$), respectively. The noninverted input signal $V_{IN}+$ is coupled to the noninverting input of comparator 54 through switch 134A controlled by signal $\phi_{D1}$ and the inverted input signal $V_{IN}-$ couples to the inverting input of comparator 54 through switch 134B also driven by control signal $\phi_{D1}$. Further, the inputs to comparator 54 are coupled to electrical ground 136 through switches 138A and 138B, respectively, which are controlled by signal $\phi_{D1}$. Inverted ($V_{CD}+$) and noninverted ($V_{CD}-$) output signals from comparator 54 are provided to up/down counter 56 which provides an output representative of the most significant bits of the data conversion.

Sigma-delta modulator stage 52 includes sigma-delta modulator 62 which has amplifier 150 with inverting and noninverting inputs and outputs. The noninverting output of amplifier 150 is selectively coupled to $V_{OD}+$ and $V_{IN}+$ by switches 152 and 154 (driven by signals $\phi_{S1}$ and $\phi_{S4}$ and capacitor 155 ($C_{SI}$). Similarly, the inverting input of amplifier 150 couples to $V_{OD}-$ and $V_{IN}-$ through switches 156 and 158, driven by control signals $\phi_{S3}$ and $\phi_{S4}$, respectively, through capacitor 160 ($C_{SI}$). Amplifier 150 receives feedback as shown in FIG. 4 through capacitors 164A, 164B ($C_{SF}$) and switches 166A, 166B and 168A, 168B which are controlled by signals $\phi_{S1}$ and $\phi_{S2}$, respectively. The inverted ($V_{DS}+$) and noninverted ($V_{DS}-$) output signals from amplifier 150 are provided to the noninverting and inverted, respectively, inputs to comparator 180. Comparator 180 provides inverted ($V_{CS}+$) and noninverted ($V_{CS}-$) outputs to filter 64 which provides an output representative of the least significant bits of the analog to digital conversion. In the above equations, $A=C_{DR}/C_{DF}$ and $B=C_{SI}/C_{SF}$.

Figure 5:
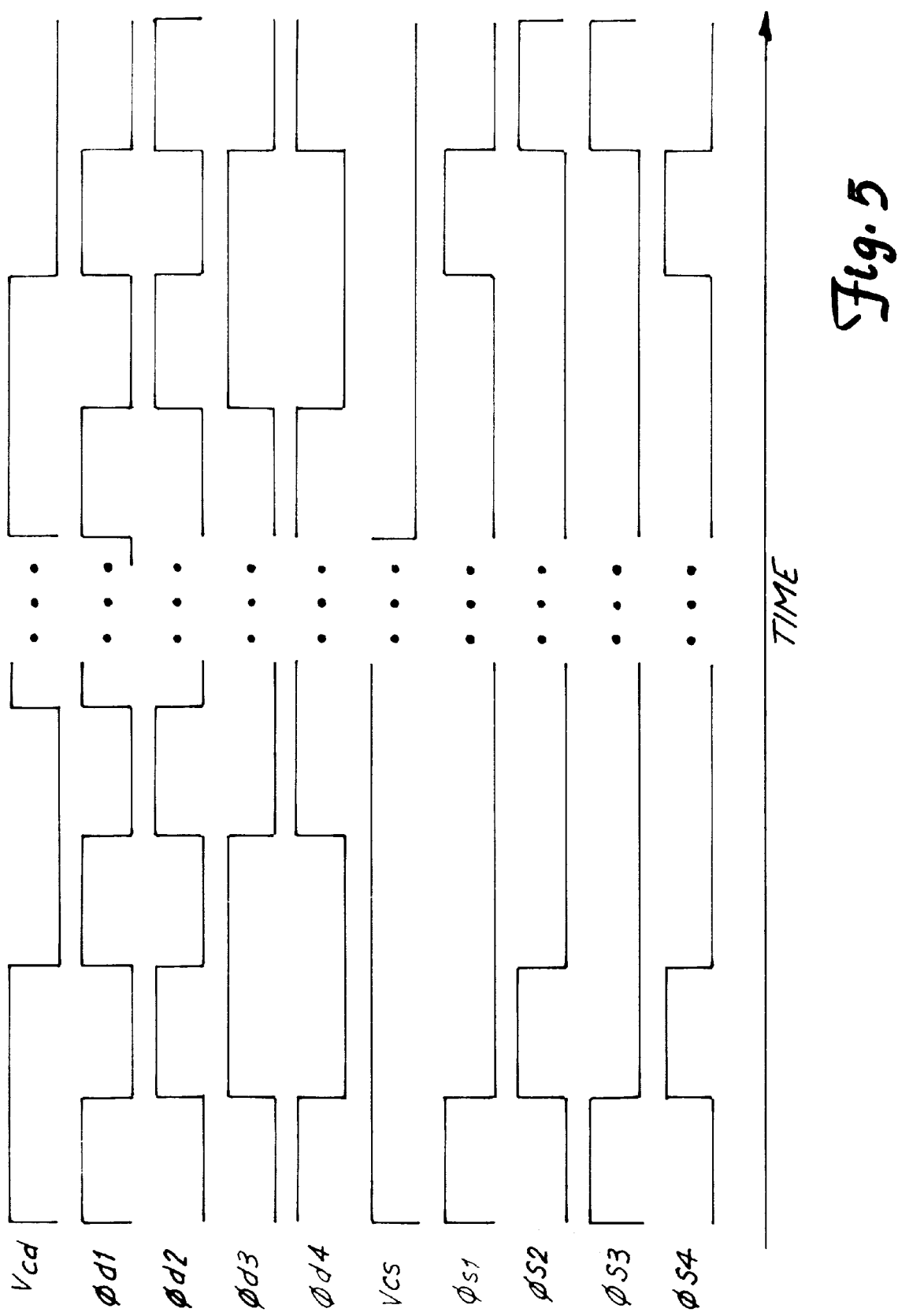
FIG. 5 is a timing diagram showing signal levels versus time for various signals in FIG. 4.

FIG. 5 is a timing diagram of the circuitry of FIG. 4 and shown various signal levels in FIG. 4 versus time. FIG. 5 shows the relationship between the output from comparator 54 ($V_{CD}$), control signals $V_{D1}-V_{D4}$, the output from comparator 180 $V_{CS}$ and control signals $V_{S1}-V_{S4}$. The bracketing and conversion functions operate as described above. With the $V_{OD}$ signals are coupled to sigma delta stage 52 to thereby provide the bracketing function. The number of bits generated by delta modulator 50 is determined by the reference voltage and the gain of the integrator. The number of bits of resolution of sigma-delta converter 52 is determined by the number of samples used per conversion.

Although the present invention has been described with reference to preferred embodiments, workers skilled in the art will recognize that changes may be made in form and detail without departing from the spirit and scope of the invention. For example, although the invention has been described in terms of a delta modulator providing the bracketing function, any type of circuitry may be implemented to bracket the input signal. Similarly, other types of analog conversion stages may be implemented other than the sigma-delta stage set forth herein. The invention is particularly well suited for implementation in process control transmitters because of the low power requirements, high accuracy and robust nature of the design. However, the analog to digital converter of the present invention may be used to convert other types of signals.

What is claimed is:

1. A transmitter of the type used to sense a process variable in an industrial process, comprising:

a sensor coupled to the process providing a sensor analog output representative of the process variable, the analog output having a sensor signal range;

an analog to digital converter providing a digitized output in response to an analog input within a converter dynamic range, the analog input operably coupled to the sensor analog output; and signal range bracketing circuitry coupled to the sensor analog output responsively providing a bracketed range of the sensor analog output to the analog to digital converter stage based upon the sensor analog output, the bracketed range less than the sensor signal range, and providing a bracket output indicative of the bracketed range, wherein the bracketed output and the digitized output are representative of the sensor analog output.

2. The transmitter of claim 1 wherein the analog to digital converter comprises a sigma-delta converter.

3. The transmitter of claim 1 wherein the signal range bracketing circuitry comprises a delta modulator.

4. The transmitter of claim 1 wherein the bracketed range has a range which is equal to the converter dynamic range.

5. The transmitter of claim 1 wherein the digitized output is related to a ratio of bracketed range and the analog input.

6. The transmitter of claim 1, wherein the analog to digital convertor includes a reference input, and wherein the signal range bracketing circuitry is adapted to sequentially provide a plurality of voltages to the reference input based upon the sensor analog output.

7. An analog to digital converter, comprising:

an analog to digital converter stage providing a digitized output in response to an analog input within a converter dynamic range;

signal range bracketing circuitry coupled to the analog input responsively providing a bracketed range of the analog input to the analog to digital converter based upon the analog input, the bracketed range less than a dynamic range of the analog input, and providing a bracket output indicative of the bracketed range, wherein the bracketed output and the digitized output are representative of the analog input.

8. The transmitter of claim 5 wherein the analog to digital converter stage comprises a sigma-delta converter.

9. The transmitter of claim 5 wherein the signal range bracketing circuitry comprises a delta modulator.

10. The transmitter of claim 5 wherein the bracketed range has a range which is equal to the converter dynamic range.

11. The analog to digital converter of claim 5 wherein the digitized output is related to a ratio of bracketed range and the analog input.

12. The analog to digital convertor of claim 5, wherein the analog to digital convertor stage includes a reference input, and wherein the signal range bracketing circuitry is adapted to sequentially provide a plurality of voltages to the reference input based upon the sensor analog output.

* * * * *